US006762116B1

(12) United States Patent
Skidmore (10) Patent No.: US 6,762,116 B1
(45) Date of Patent: Jul. 13, 2004

(54) SYSTEM AND METHOD FOR FABRICATING MICROCOMPONENT PARTS ON A SUBSTRATE HAVING PRE-FABRICATED ELECTRONIC CIRCUITRY THEREON

(75) Inventor: George D. Skidmore, Richardson, TX (US)

(73) Assignee: Zyvex Corporation, Richardson, TX (US)

( * ) Notice: Subject to any disclaimer, the term of this patent is extended or adjusted under 35 U.S.C. 154(b) by 0 days.

(21) Appl. No.: 10/167,939

(22) Filed: Jun. 12, 2002

(51) Int. Cl.[7] ................................................ H01L 21/44
(52) U.S. Cl. ...................... 438/598; 438/50; 438/51; 438/52; 438/53; 438/689; 438/690; 257/414; 257/415; 257/416; 257/417; 257/254
(58) Field of Search ........................... 438/598, 50–53, 438/689–694, 14, 109, 460–462; 257/414–417, 254; 216/52

(56) References Cited

U.S. PATENT DOCUMENTS

| | | | |
|---|---|---|---|
| 5,326,726 A | | 7/1994 | Tsang et al. |
| 5,393,375 A | * | 2/1995 | MacDonald et al. ......... 156/643 |
| 5,412,186 A | * | 5/1995 | Gale ........................... 219/679 |
| 5,511,428 A | * | 4/1996 | Goldberg et al. .............. 73/777 |
| 5,717,513 A | * | 2/1998 | Weaver ....................... 359/221 |
| 5,847,454 A | * | 12/1998 | Shaw et al. .................. 257/734 |
| 5,870,007 A | * | 2/1999 | Carr et al. ..................... 33/262 |
| 5,963,788 A | * | 10/1999 | Barron et al. .................. 438/48 |
| 6,063,696 A | * | 5/2000 | Brenner et al. ............... 438/465 |
| 6,103,399 A | * | 8/2000 | Smela et al. ................. 428/623 |
| 6,219,254 B1 | * | 4/2001 | Akerling et al. ............. 361/763 |
| 6,262,464 B1 | * | 7/2001 | Chan et al. ................... 257/414 |
| 6,300,156 B1 | * | 10/2001 | Decker et al. ................. 438/52 |
| 6,398,280 B1 | | 6/2002 | Parker et al. |
| 6,404,207 B1 | * | 6/2002 | Bhushan ...................... 324/671 |
| 6,538,233 B1 | * | 3/2003 | Lee et al. .............. 219/121.85 |
| 2001/0013630 A1 | * | 8/2001 | Cho et al. .................... 257/419 |
| 2002/0125208 A1 | * | 9/2002 | Christenson et al. .......... 216/2 |

OTHER PUBLICATIONS

U.S. patent application Ser. No. 09/570170.
U.S. patent application Ser. No. 09/616500.
U.S. patent application Ser. No. 09/643011.
U.S. patent application Ser. No. 10/071772.

* cited by examiner

*Primary Examiner*—Matthew Smith
*Assistant Examiner*—Granvill D. Lee, Jr.
(74) *Attorney, Agent, or Firm*—Haynes & Boone, LLP (57) ABSTRACT

A system and method is described for fabricating microcomponents onto pre-existing integrated electronics. One embodiment of the present invention provides additional process steps after completion of all electronics fabrication that may etch trough the oxide of any passivation layer that may be there to the single crystal silicon (SCS) of a silicon on insulator (SOI) integrated circuit. Once at the SCS level of the existing wafer, any number of microcomponents, such as connectors, receptacles, handles, tethers, and the like may preferably be fabricated onto the chip using relatively low temperature and inexpensive processing; thus, preferably preserving the integrity of the preexisting electronics.

32 Claims, 5 Drawing Sheets

SYSTEM AND METHOD FOR FABRICATING MICROCOMPONENT PARTS ON A SUBSTRATE HAVING PRE-FABRICATED ELECTRONIC CIRCUITRY THEREON

CROSS-REFERENCE TO RELATED APPLICATIONS

This application is related to commonly assigned U.S. patent application Ser. No. 09/570,170, filed May 11, 2000, entitled "SYSTEM AND METHOD FOR COUPLING MICRO-COMPONENTS"; U.S. Pat. No. 6,398,280, issued Jun. 4, 2002, entitled "GRIPPER AND COMPLEMENTARY HANDLE FOR USE WITH MICROCOMPONENTS"; Ser. No. 09/616,500, filed Jul. 14, 2000, entitled "SYSTEM AND METHOD FOR CONSTRAINING TOTALLY RELEASED MICROCOMPONENTS"; Ser. No. 09/643,011, filed Aug. 21, 2000, entitled "SYSTEM AND METHOD FOR COUPLING MICROCOMPONENTS UTILIZING A PRESSURE FITTING RECEPTACLE"; and Ser. No. 10/071,772, filed Feb. 7, 2002, entitled "SYSTEM AND METHOD FOR LATCHING A MICRO-STRUCTURE AND A PROCESS FOR FABRICATING A MICRO-LATCHING STRUCTURE," the disclosures of which are hereby incorporated herein by reference.

TECHNICAL FIELD

The present application relates in general to sub-millimeter devices, and more particularly, to a system and method for fabricating Microelectromechanical (MEM) devices into pre-existing integrated circuits.

BACKGROUND OF THE INVENTION

MEM devices have many applications for forming any variety of microsensors, microactuators, and other microcomponents. The term "microcomponent" is used herein generically to encompass sub-millimeter electronic components, sub-millimeter mechanical components, as well as MEM devices and MEM Systems (MEMS) components. The monolithic integration of MEM devices with electronic circuitry has been suggested to increase performance, functionality, and reliability of such microcomponents, in addition to significantly reducing the size and cost of the components. Such electronic circuitry may comprise simple electronic components, such as amplifiers having only a few transistors, to complex electronics, such as microprocessors or microcontrollers. The microcomponents typically act as the sensor that relates information to the electronics for processing in some fashion. Typically, because of the incompatibilities between integrated circuit fabrication techniques and MEM device fabrication techniques, methods for integrating electronic circuits and MEM devices have been suggested which either require complex interleaving of fabrication steps or requiring the fabrication of the MEM device first followed by the electronic circuitry.

U.S. Pat. No. 5,326,726 issued to Tsang, et al., discloses such an interleaved or merged process for fabricating a monolithic chip integrating both electronic circuitry with microstructures. In Tsang, et al., the process described fabricating both the electronic circuitry and the microstructure transducer wherein the steps of fabricating the microstructure transducer are generally interleaved among the steps for fabricating the BIMOS circuitry.

U.S. Pat. No. 5,963,788 issued to Barron, et al., discloses another process that fabricates a high quality MEM device before fabrication of the electronic circuitry. The high quality MEM device of Barron, et al., is produced in a mesa (i.e., a cavity etched within the substrate). The processes described in Barron, et al., for fabricating the MEM device typically involve an annealing step that generally raises the temperature to approximately 1100° centigrade for around an hour. Such a high temperature would generally destroy any pre-fabricated electronic circuitry. Thus, the Barron, et at, process requires that the MEMs device be fabricated first.

The problem with the current systems and methods for monolithically fabricating integrating electronic circuitry with MEMs devices is that fabrication processes for the electronics are typically connected or tied in some way to the fabrication of the MEMs device. Therefore, a microcomponent could not be added to existing electronic circuitry. For example, if an integrated circuit chip design includes all of the favorable processing for a certain system, no microcomponents could be added, as they are developed, in order to improve the application of the system.

BRIEF SUMMARY OF THE INVENTION

The present invention is directed to a system and method for fabricating microcomponents onto pre-existing/pre-fabricated integrated electronics. One embodiment of the present invention provides additional process steps after completion of all electronics fabrication that etches through the oxide of the passivation layer to the single crystal silicon (SCS) layer of a silicon on insulator (SOI) integrated circuit (IC). Once at the SCS layer of the existing wafer, any number of microcomponents, such as connectors, receptacles, handles, tethers, fasteners, clasps, latches, probes, actuator arms, and the like may be fabricated onto the chip using relatively low temperature and inexpensive processing; thus, preserving the pre-existing electronics.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
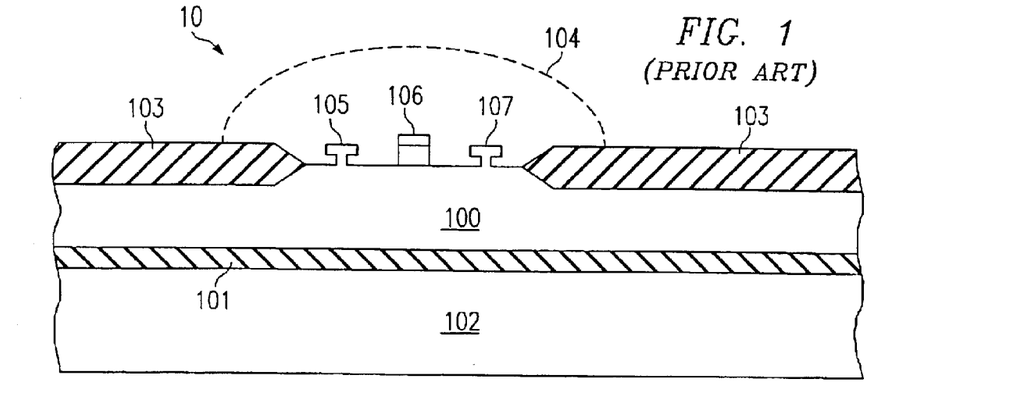
FIG. 1 is a cross-sectional view of a typical, prior art SOI integrated circuit with pre-fabricated electronics.

FIG. 1 is a cross-sectional diagram of a typical electronic component integrated onto an SOI integrated circuit. An SOI integrated circuit typically comprises SCS layer 100, buried oxide layer 101 (BOx), and handle layer 102, generally comprising a silicon substrate. A passivation or scratch layer may be included on SCS 100 comprising field oxide 103 in some embodiments. The electronic circuitry component of SOI chip 10 is generally found within the area marked by dotted line 104. Electronics island 104 is illustrated as a single transistor including electrical contacts 105, 106, and 107.

Figure 2A:
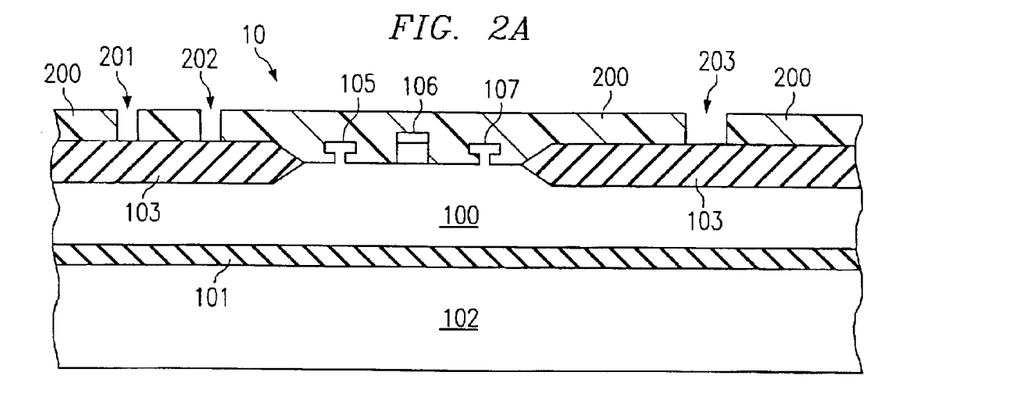
FIG. 2A is a cross-sectional view of a SOI integrated circuit according to the teachings of an embodiment of the present invention including a patterned layer of resist.
Figure 2B:
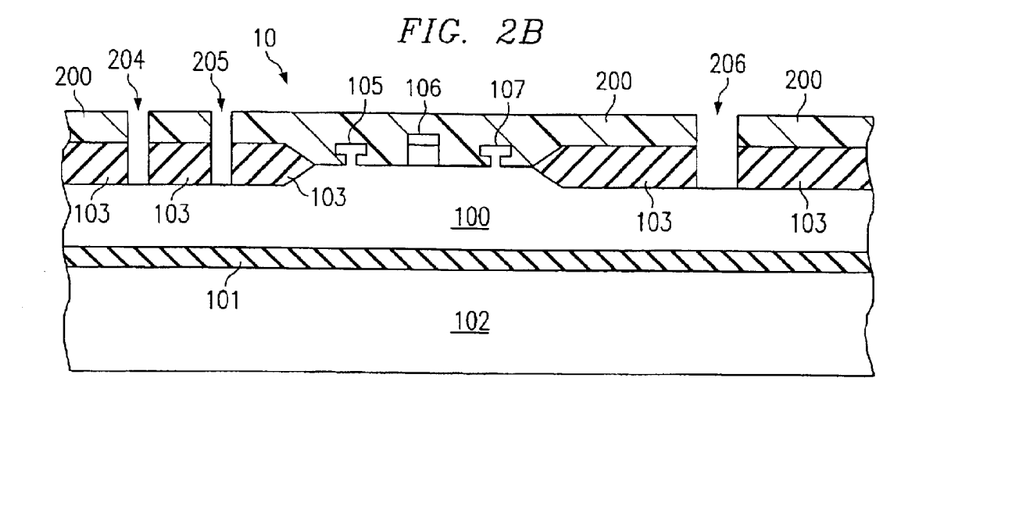
FIG. 2B is a cross-sectional view of a SOI integrated circuit according to the teachings of an embodiment of the present invention including openings etched through a passivation layer.

One embodiment of the present invention provides a system and method for adding microcomponents to pre-fabricated SOI chip 10 of FIG. 1. The steps of the inventive method are depicted in FIGS. 2A through 2K FIG. 2A is a cross-sectional diagram of SOI chip 10 preferably including an additional layer of resist 200. Resist layer 200 may comprise any number of the different, known negative or positive photoresist chemicals applied to SOI chip 10. Resist layer 200 also preferably includes pattern etches at openings 201, 202, and 203. Pattern openings 201, 202, and 203 allow the etching process to reach field oxide layer 103. Openings in field oxide layer 103 maybe etched to expose SCS layer 100. FIG. 2B illustrates SOI chip 10 after etching through resist layer 200 exposing the substrate. The SOI chip depicted in FIG. 2B illustrates the etched openings in the field oxide layer 103 at openings 204, 205, and 206. With the openings of field oxide layer 103, SCS layer 100 is now exposed and ready for further processing.

Figure 2C:
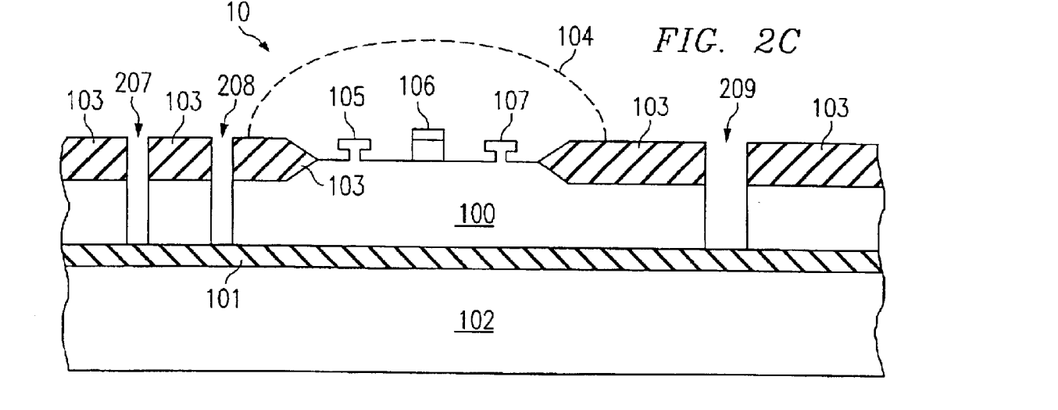
FIG. 2C is a cross-sectional view of a SOI integrated circuit according to the teachings of an embodiment of the present invention including openings etched through an SCS layer.

FIG. 2C is a cross-sectional diagram of processed SOI chip 10 illustrating the etched paths 207, 208, and 209 that have been etched through SCS layer 100. The process of etching through SCS layer 100 allows the fabrication of any number or variety of different micromechanical components. For example, connectors, receptacles, handles, tethers, fasteners, clasps, latches, probes, actuators, and the like may be fabricated onto the chip allowing for further processing by other microcomponents. Embodiments of such technology that incorporate connectors, receptacles, handles, and tethers have been demonstrated in commonly-owned, co-pending patent applications commonly assigned U.S. patent application Ser. No. 09/570,170, filed May 11, 2000, entitled "SYSTEM AND METHOD FOR COUPLING MICRO-COMPONENTS"; U.S. Pat. No. 6,398,280 issued Jun. 4, 2002, entitled "GRIPPER AND COMPLEMENTARY HANDLE FOR USE WITH MICROCOMPONENTS"; Ser. No. 09/616,500, filed Jul. 14, 2000, entitled "SYSTEM AND METHOD FOR CONSTRAINING TOTALLY RELEASED MICROCOMPONENTS"; Ser. No. 09/643,011, filed Aug. 21, 2000, entitled "SYSTEM AND METHOD FOR COUPLING MICROCOMPONENTS UTILIZING A PRESSURE FITTING RECEPTACLE"; and Ser. No. 10/071,772, filed Feb. 7, 2002, entitled "SYSTEM AND METHOD FOR LATCHING A MICRO-STRUCTURE AND A PROCESS FOR FABRICATING A MICRO-LATCHING STRUCTURE," the disclosures of which are hereby incorporated herein by reference. Using such technology the micromechanical components may preferably be fabricated directly onto the preexisting integrated circuit chip.

In the example shown in FIG. 2C, etched openings 207, 208, and 209 represent the edge of the part of the receptacle or handle and another edge of the part. Specifically a part edge is shown as space 207; the receptacle or handle is shown as opening 208; and the other part edge is shown as opening 209; thus, forming part edges 207 and 209 and receptacle or handle 208. It should be noted that many different kinds of microcomponents may be etched into SCS layer 100 in addition to the microcomponents listed above.

In the final process of fabricating the integrated electronics and micromechanical components, the oxide layers shown as BOx 101 may be released through a hydroflourine (HF) or other oxide-removing bath. As shown in the device of FIG. 2C, if BOx layer 101 were to be etched away, electronics island 104 and any of the micromechanical parts, such as a handle for receptacle 208 would be typically released from the substrate through part edges 207 and 209. Without any device to restrain the part, the part may simply float away. It is therefore desirable to fabricate restraining devices such as tethers, constraints, or the like onto the integrated system.

Figure 2D:
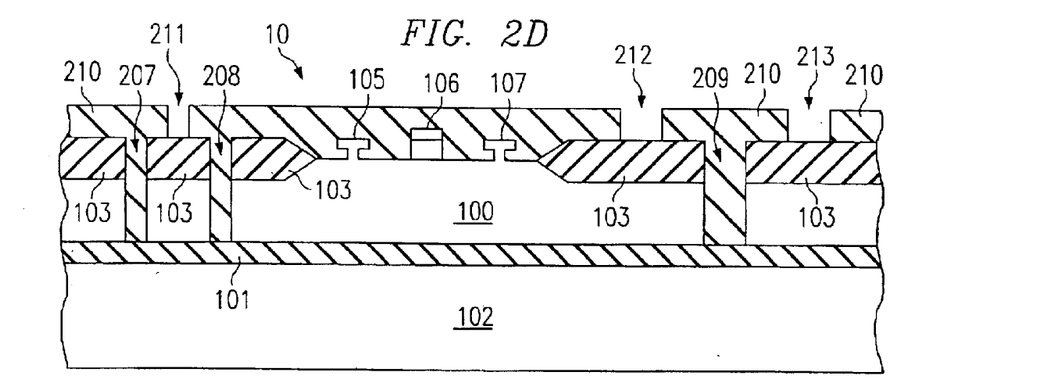
FIG. 2D is a cross-sectional view of a SOI integrated circuit according to the teachings of an embodiment of the present invention including a patterned sacrificial layer.
Figure 2E:
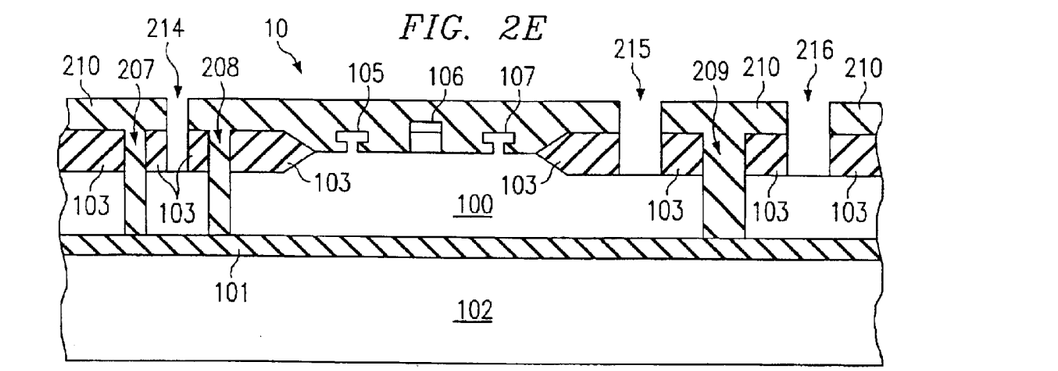
FIG. 2E is a cross-sectional view of a SOI integrated circuit according to the teachings of an embodiment of the present invention including openings etched through the passivation layer.

The first step to establishing a tether or constraint onto the system is to preferably lay a sacrificial layer across the top of the device. The sacrificial layer essentially provide spacing that will preferably be exposed later in the process. FIG. 2D is a cross-sectional diagram illustrating SOI chip 10 from FIG. 2C which includes a new layer of resist, sacrificial layer 210, laid across the top of the device. As can be seen in FIG. 2D, sacrificial layer 210 preferably fills the openings of part edges 207 and 209 and receptacle or handle 208. Sacrificial layer 210, illustrated in FIG. 2D, also shows pattern openings at opening 211, 212, and 213. The pattern openings, preferably allow etching away additional parts of field oxide layer 103, thus, exposing SCS layer 100 for further processing. FIG. 2E is a cross-sectional diagram illustrating SOI chip 10 which has now been etched to produced openings 214, 215, and 216 in field oxide layer 103. Openings 214, 215, and 216 reveal SCS layer 100 for the processing of the tether layer.

Figure 2F:
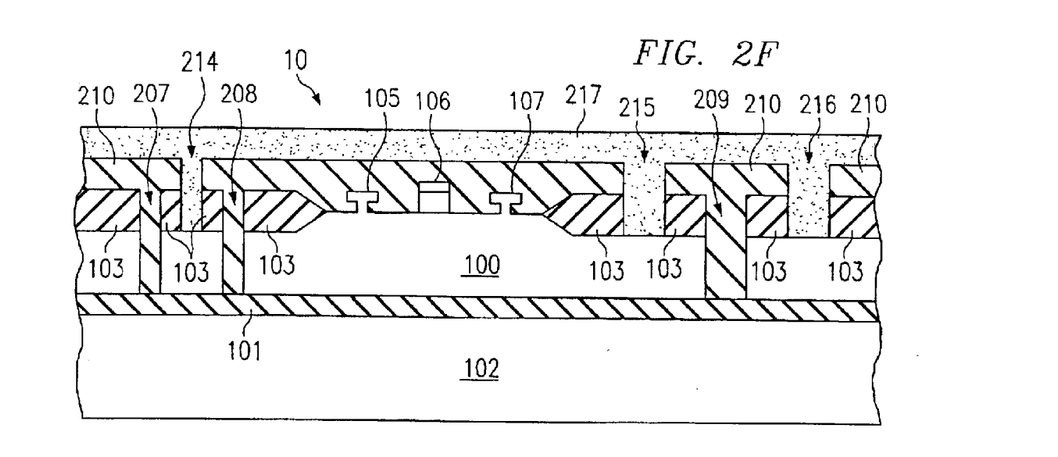
FIG. 2F is across-sectional view of a SOI integrated circuit according to the teachings of an embodiment of the present invention including a layer of tether material.
Figure 2G:
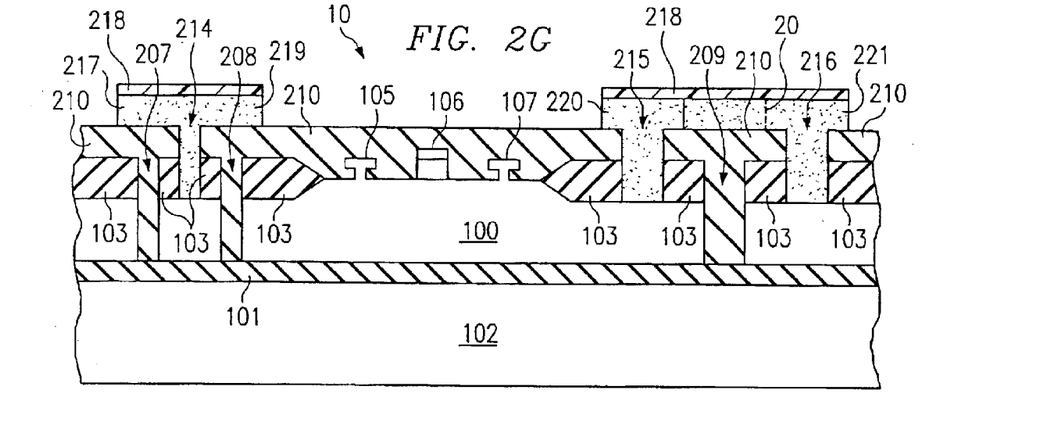
FIG. 2G is a cross-sectional view of a SOI integrated circuit according to the teachings of an embodiment of the present invention including the etched tether material.

The next step in fabricating a tether or constraint preferably comprises layering tether material 217 onto the top of SOI chip 10, as illustrated in FIG. 2F. Tether material 217 preferably creates a layer on top of SOI chip 10 and fills in openings 214, 215, and 216 down to SCS layer 100. The next step in forming a tether on SOI chip 10 involves laying another layer of photo resist on top of SOI chip 10 preferably exposing a pattern in that layer of photo resist and further allowing etching the tether material 217 to remove the unwanted material. FIG. 2G illustrates a cross-sectional diagram of SOI chip 10 after the pattern and etching processes have been performed on tether material 217. As seen in FIG. 2G, resist material 218 remains on top of tether material 217 and has formed, through the etching process, tethers 219, 220, and 22 1. Because FIG. 2G is a cross-sectional view of chip SOI chip 10, tethers 220 and 221 appear to connect. However, as illustrated by dotted line 20, dotted line 20 represents the edge of tether 220 that is positioned behind tether 221, thus, tether 220 and 221 are completely separate.

Figure 2H:
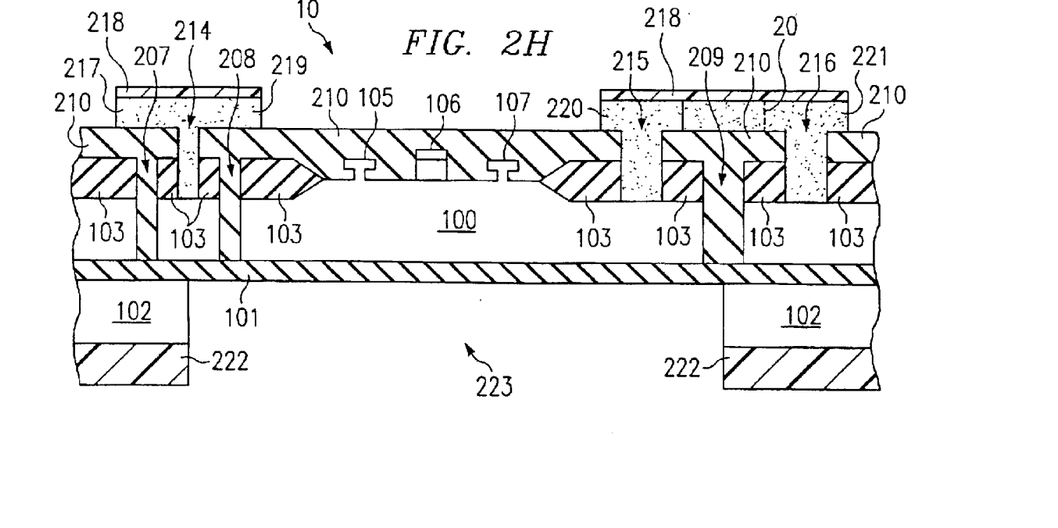
FIG. 2H is a cross-sectional view of a SOI integrated circuit according to the teachings of an embodiment of the present invention including an opening etched in the backside of the SOI wafer.

In order to release the integrated circuit and microcomponent, BOx layer 101 would typically be removed or etched away to preferably remove any physical contact of the integrated component with handle layer 102. To facilitate removal of BOx layer 101, an access point must be provided. FIG. 2H is a cross-sectional diagram of SOI chip 10 including cavity 223 which has been etched out of handle layer 102. Resist layer 222 is shown remaining on the intact portions of handle layer 102 revealing cavity 223. Cavity 223 provides not only an access point to BOx layer 101, but also preferably assists in restricting the movement of the released MEM device.

In additional embodiments of the present invention the side walls of cavity 223 may have a larger opening at the bottom of handle layer 102 and a smaller opening at BOx layer 101. An etching process that may accomplishes such a geometry would generally use an isotropic wet etchant, such as potassium hydroxide (KOH), tetramethyl ammonium hydroxide (TMAH), ethylenediamine pyrocatechol (EDP), or the like, to form one or more cavities that can be, for example, between 2 to 20 micrometers or more deep with a substantially planar bottom surface and the sloping inner-sidewalls. The sloping innersidewalls are usually formed by the selective etching along preferred (111) crystallographic plains as is common with isotropic wet etchants, such as KOH. Other types of etchants or etching means may also be used to form such a shaped cavity.

It should be noted that additional embodiments of the present invention may be fabricated using standard, non-SOI silicon wafers. In such embodiments the integrated circuit and microcomponent may be released from the silicon substrate by etching a canal around and underneath the IC and microcomponent. The canal would remove any physical contact between the released MEM device and the underlying silicon substrate.

Figure 2I:
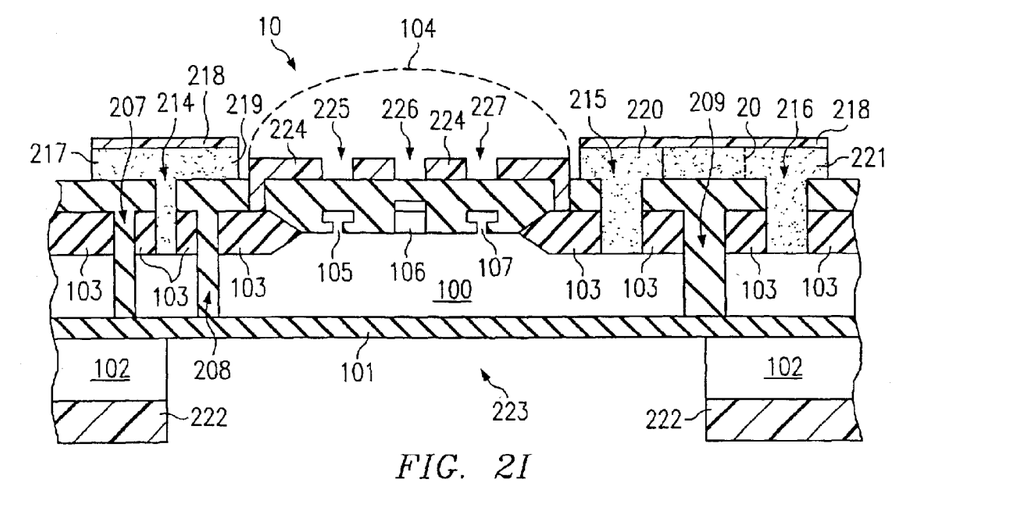
FIG. 2I is a cross-sectional view of a SOI integrated circuit according to the teachings of an embodiment of the present invention including a patterned and etched layer of resist spun onto the pre-fabricated electronics.

To protect electronics 104 during the HF release cycle, a layer of resist is preferably spun onto the top of SOI chip 10. After spinning the resist layer onto the top of SOI chip 10, it is preferably patterned to reveal the layers to be etched. It is also generally patterned with openings 225, 226, and 227, as shown in FIG. 2I to provide electrical contact points to electronic contacts 105, 106, and 107. FIG. 2I is a cross-sectional diagram of SOI chip 10 that has been processed to preferably include spin resist layer 224 with openings 225, 226, and 227, and has preferably been etched to expose the remaining oxide layers of the system.

Figure 2J:
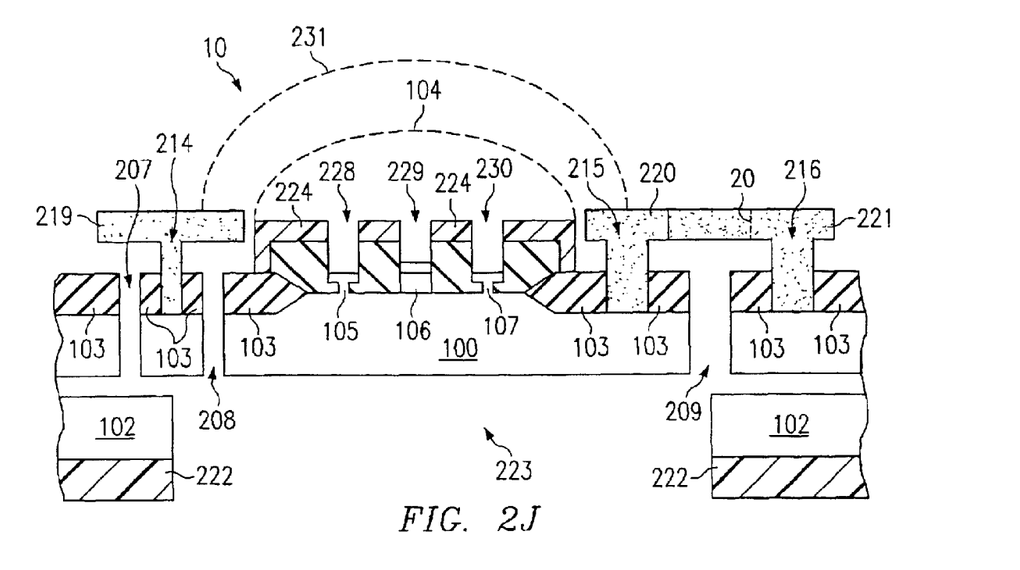
FIG. 2J is a cross-sectional view of a SOI integrated circuit according to the teachings of an embodiment of the present invention after the exposed oxide layers are removed.

FIG. 2J is a cross-sectional diagram of SOI chip 10 with sacrificial layer 210 and all remaining oxides removed. The removal of these oxides preferably frees the system from the remainder of the substrate. The system includes the MEM device now formed by the integrated circuit and the micromechanical component which remain physically coupled together. Additionally, it completes the formation of tethers 219, 220, and 221. Integrated unit 231, as shown on FIG. 2J, represents the integration of the electronic circuitry 104 and the micromechanical components of receptacle or handle 208, tethers 219, 220 and 221, and even part edges 207 and 209.

Figure 2K:
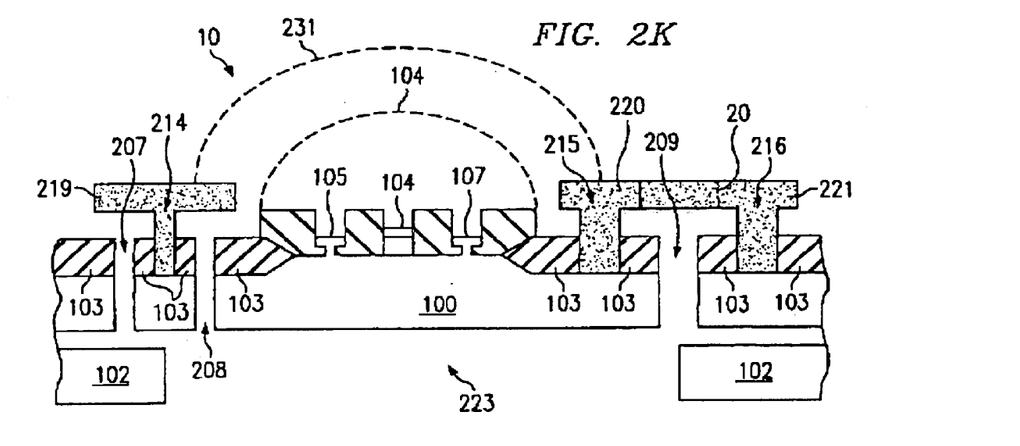
FIG. 2K is a cross-sectional view of a SOI integrated circuit according to the teachings of an embodiment of the present invention after removing the remaining photoresist layers.

Spin resist layer 224 is then preferably removed from integrated unit 231. FIG. 2K is a cross-sectional diagram of SOI chip 10 that now preferably includes integrated unit 231 without spin resist layer 224. In order to prevent integrated unit 231 from flying off of SOI chip 10, tethers 219, 220, and 221 preferably restrict the movement of integrated unit 231. In operation, if integrated unit 231 begins to rise above handle layer 102, tether 221 preferably restricts integrated unit 231 from traveling above the tether. Conversely, if integrated 231 begins to drop down towards handle layer 102, tethers 219 and 220 preferably restrict integrated unit 231 from passing below the reach of tethers 219 and 220. Thus, integrated unit 231 remains in place on SOI chip 10, awaiting further processing from other microcomponents or micromechanical devices.

It should be noted that in additional embodiments of the present invention, only one tether may be necessary to adequately restrict the movement of the MEM device. In such single tether embodiments, the process of fabricating the device would preferably include the formation of a cavity on the bottom side of the wafer, as shown by cavity 223 in FIGS. 2H–K Thus, the present invention should not be considered as limited to just two or more tethers, but may incorporate any desirable number from one to many.

Figure 3:
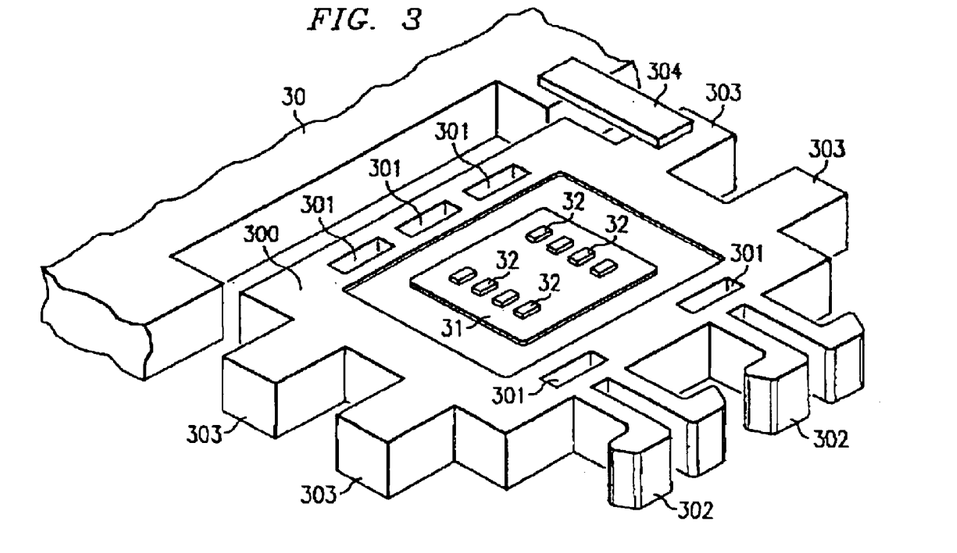
FIG. 3 is an isometric view of a MEMs device configured and fabricated according to the teachings of an embodiment of the present invention.

FIG. 3 is an isometric view of pre-fabricated electronic circuitry retrofitted with micromechanical devices fabricated according to one embodiment of the present invention. Integrated device 300 is preferably separated from substrate 30, being held in place by tether 305. Tether 304 is attached to integrated unit 300 and preferably prevents integrated unit 300 from moving off of substrate 30. Electronics island 31 is the area on integrated unit 300 that contains all of the electronics and electronic circuitry of integrated unit 300. Openings 32 within electronics island 31 preferably provide access or contact points to the electrical connections of the electronics within electronics island 31. Receptacle or handles 301, the micromechanical retrofits, preferably provide access points for other microcomponents to grab or grip integrated unit 300 and remove the unit from substrate 30. Integrated unit 300 also includes connectors 302 and 303 positioned on each side of integrated unit 300 that allow integrated unit 300 to be positioned or placed in any different number of other microcomponents or MEMs devices.

Using an integrated electronics and micromechanical device as shown in integrated unit 300 of FIG. 3, additional microcomponents such as microgrippers or other micro tools or any other tools capable of handling sub-millimeter components may preferably grip integrated unit 300, remove integrated unit 300 from substrate 30, and assemble integrated unit 300 into an existing MEMs device or other electrical or micromechanical or microelectrical component or device. Using this embodiment of the present invention preferably allows for the assembly of more complex microelectromechanical devices or other integrations of sub-millimeter MEMs/NEMs devices and electronics. This embodiment of the present invention also preferably allows for the complete separation of fabrication between electronics and sub-millimeter electronic devices, such as MEMs devices, and other sub-millimeter mechanical devices or microcomponents.

An example of the use of such an integrated unit as shown in FIG. 3, a microgripper may preferably grab integrated unit 300 at any one or more of handle receptacles 301s and remove integrated unit 300 from substrate 30 by bending, breaking off, or in any other way deflecting tether 304. An existing MEMs device may be fabricated with edge contacts capable of forming an electrical connection with the electrical connectors within electronics island 31 through openings 32. Thus, in order to assemble the MEM machine, the microgripper or microtool may place integrated unit 300 into specifically built receptacles that may hold anchors 302 or latches 303 into place against the existing MEMs device in such a manner that the edge connectors from the MEMs device will fit within the openings 32 to make connection with the electrical devices within electronics island 31, thus, forming a complete electromechanical microelectromechanical system.

It should be noted that the tethers or constraints described in embodiments of the present invention are preferably fabricated from material that allows the restriction function to be defeated. By applying an external force or stimulus to the micromechanical elements the MEM device may be removed from the underlying IC by breaking or deflecting the tethers. Stimuli such as electric charge, current, or potential, magnetic fields, thermal, physical, or fluidic forces may be used to remove the MEMs. As long as the external stimuli are one or more of physical, electrical, magnetic, fluidic, or thermal in nature, the MEM element may be removed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a sub-millimeter component into an integrated circuit (IC), said method comprising the steps of:

providing said IC comprising at least one electronic circuit element existing thereon;

removing portions of a substrate of said IC to form said sub-millimeter component;

forming one or more tethers onto said IC;

releasing a microelectromechanical (MEM) device from said IC, said MEM device comprising:
said at least one electronic circuit element; and
said sub-millimeter component, wherein said releasing maintains a physical coupling between said at least one electronic circuit element and said sub-millimeter component, wherein said one or more tethers at least partially restrict movement of said released MEM device.

2. The method of claim 1 further comprising the step of:
removing a passivation layer to expose said substrate.

3. The method of claim 2 wherein said etching said removing a passivation layer includes the steps of:
depositing a layer of photoresist onto a surface of said IC;
forming a pattern into said photoresist layer; and
etching through said pattern to remove portions of said passivation layer corresponding to said pattern.

4. The method of claim 1 wherein said forming one or more tethers step includes the steps of:
depositing a tether material onto a surface of said IC;
selectively depositing a photoresist layer onto a surface of said tether material; and
etching through said photoresist layer to remove selected portions of said tether material to form said tether.

5. The method of claim 4 wherein said forming one or more tethers step further includes the steps of:
prior to said depositing said tether material step:
depositing a sacrificial layer onto a top of said IC;
selectively depositing another photoresist layer onto a surface of said sacrificial layer;
etching through said another photoresist layer to remove selected portions of said sacrificial layer; and
subsequent to said etching through said photoresist layer step:
removing said sacrificial layer.

6. The method of claim 1 wherein said releasing step includes the steps of:
etching a canal in said IC around said MEM device, wherein said canal removes physical contact between said MEM device and said IC.

7. The method of claim 1:
wherein said IC comprises a silicon on insulator (SOI) wafer; and
wherein said releasing step includes the step of:
removing an exposed buried oxide layer of said SOI wafer.

8. The method of claim 1 wherein said IC comprises an SOI wafer.

9. The method of claim 1 further comprising:
applying photoresist over said electronic circuit element prior to said releasing step.

10. A microelectromechanical (MEM) component comprising:
an electronics island having at least one electronic circuit element formed therein, said island released from an integrated circuit (IC) substrate;
one or more micromechanical retrofits coupled to said electronics island, said retrofits formed from said IC substrate, wherein said one or more micromechanical retrofits are formed after fabrication of said at least one electronic circuit element, and one or more constraints maintaining said MEM component in proximity to said IC substrate, wherein said one or more constraints are formed after fabrication of said at least one electronic circuit element.

11. The MEM component of claim 10 wherein said one or more constraints are formed on one of:

said MEM component; and said IC substrate.

12. The MEM component of claim 10 wherein said one or more constraints are fabricated from material allowing said MEM component to be removed from said proximity to said IC substrate upon application of an external stimulus.

13. The MEM component of claim 12 wherein said external stimulus comprises at least one of:

an electrical charge;

an electrical current;

an electrical potential;

a magnetic field;

a fluidic force;

thermal energy; and a mechanical force.

14. The MEM component of claim 10 wherein said electronics island includes one or more contacts facilitating electrical connection with said at least one electronic circuit element.

15. The MEM component of claim 10 wherein said one or more micromechanical retrofits comprises at least one of:

a handle;

a connector;

a receptacle;

a fastener;

a clasp;

a latch;

a probe; and an actuator arm.

16. The MEM component of claim 10 wherein said IC substrate comprises a silicon on insulator (SOI) substrate.

17. The MEM component of claim 16 wherein said electronics island and said one or more micromechanical retrofits are released from said IC substrate by removing a buried oxide layer of said SOI substrate.

18. The MEM component of claim 10 further comprising:

one or more additional micromechanical retrofits coupled to one or more of:

said electronics island; and said one or more micromechanical retrofits, said one or more additional micromechanical retrofits formed from at least one additional substrate layer and released from said at least one additional substrate layer.

19. A method for retrofitting a silicon on insulator (SOI) integrated circuit (IC) with a micromechanical element, said SOI IC having a circuitry island, comprising at least one electronic circuit element, existing therein, said method comprising the steps of:

applying a layer of photoresist on a top side of said SOI IC;

patterning said layer according to a design representing said micromechanical element;

selectively etching through a single crystal silicon (SCS) layer of said SOI IC responsive to said design;

removing a buried oxide (BOx) layer of said SOI IC to release said circuitry island and said micromechanical element, wherein said micromechanical element is coupled to said circuitry island; and fabricating at least one tether for restricting a motion of said circuitry island and said micromechanical element.

20. The method of claim 19 where said at least one tether is fabricated on one of:

said SOI IC; and said micromechanical element.

21. The method of claim 19 further comprising the step of:

applying an external stimulus to defeat said restricting motion of said at least one tether.

22. The method of claim 21 wherein said external force comprises at least one of:

physical stimulus;

an electrical stimulus;

a fluidic stimulus;

a magnetic stimulus; and a thermal stimulus.

23. The method of claim 19 wherein said micromechanical element comprises a plurality of layers, wherein said plurality of layers comprises:

a layer formed by said selectively etching step; and at least one additional layer formed by selectively etching through one or more additional SCS layers.

24. The method of claim 19 further comprising the step of:

removing selected portions of a scratch layer from said SOI IC prior to said applying said layer step.

25. A system for adding micromechanical elements to integrated circuits (ICs), said ICs formed on a silicon on insulator (SOI) wafer and including an electronic circuitry island comprising an electronic circuit element, said system comprising:

means for establishing a pattern of photoresist on said IC, said pattern representing a design for said micromechanical elements;

means for etching through a single crystal silicon (SCS) layer of said SOI wafer according to said design;

means for removing a buried oxide (BOx) layer to release said micromechanical elements and said electronic circuitry island from said IC; and means for integrally fabricating at least one tether on said IC to temporarily restrict motion of said released electronic circuitry island and said released micromechanical elements.

26. The system of claim 25 wherein said micromechanical elements comprise at least one of:

a handle;

a connector;

a receptacle;

a fastener;

a clasp;

a latch;

a probe; and an actuator arm.

27. The system of claim 25 further comprising:

means for protecting said pre-existing electronic circuitry island prior to said means for etching through said SCS layer.

28. The system of claim 25 further comprising:
means for providing electrical contacts to facilitate electrical connection to said electronic circuitry island.

29. The system of claim 25 further comprising:
means for etching through a scratch layer of said SOI wafer prior to said means for etching through said SCS layer.

30. The system of claim 25 wherein said means for fabricating includes:
means for depositing a tether material onto said surface of said SOI wafer;
means for selectively depositing a resist layer onto a surface of said tether material;
means for patterning said resist layer responsive to a design corresponding to said tether; and
means for etching through said patterned resist layer to remove selected portions of said tether material corresponding to said design.

31. The system of claim 30 wherein said means for fabricating further includes:
prior to said means for depositing:
  means for depositing a spacing layer onto a top of said IC;
  means for selectively depositing a spacing resist layer onto a surface of said spacing layer;
  means for etching through said spacing resist layer to remove selected portions of said spacing layer to expose selected portions of said SCS layer; and
after said means for etching through said patterned resist layer:
  means for removing said spacing layer.

32. The system of claim 25 further comprising:
means for adding at least one additional layer to said micromechanical elements, wherein said at least one additional layer is formed by means for etching through an additional single crystal silicon (SCS) layer of an additional SOI wafer.

* * * * *

UNITED STATES PATENT AND TRADEMARK OFFICE
CERTIFICATE OF CORRECTION

PATENT NO. : 6,762,116 B1 Page 1 of 1
DATED : July 13, 2004
INVENTOR(S) : George D. Skidmore It is certified that error appears in the above-identified patent and that said Letters Patent is hereby corrected as shown below:

Title page,
Item [57], ABSTRACT,
Line 5, the word "trough" should be replaced with -- through --;

Column 3,
Line 16, the word "across-sectional" should be replaced with -- a cross-sectional --;
Line 26, the wording "Fig. 21" should be replaced with -- Fig. 2I --;

Column 4,
Line 1, the word "maybe" should be replaced wth -- may be --;

Signed and Sealed this

Twenty-third Day of November, 2004

JON W. DUDAS
*Director of the United States Patent and Trademark Office*